US006858478B2

(12) United States Patent
Chau et al.

(10) Patent No.: US 6,858,478 B2
(45) Date of Patent: Feb. 22, 2005

(54) TRI-GATE DEVICES AND METHODS OF FABRICATION

(75) Inventors: Robert S. Chau, Beaverton, OR (US);
Brian S. Doyle, Portland, OR (US);
Jack Kavalieros, Portland, OR (US);
Douglas Barlage, Durham, NC (US);
Suman Datta, Portland, OR (US);
Scott A. Hareland, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/367,263

(22) Filed: Feb. 14, 2003

(65) Prior Publication Data

US 2004/0036127 A1 Feb. 26, 2004

Related U.S. Application Data

(63) Continuation-in-part of application No. 10/227,068, filed on Aug. 23, 2002.

(51) Int. Cl.⁷ .......................... H01L 21/00; H01L 21/84
(52) U.S. Cl. .................. 438/149; 438/157; 438/283
(58) Field of Search .............................. 438/149, 157, 438/176, 197, 283, 479, 517, 770

(56) References Cited

U.S. PATENT DOCUMENTS

| 5,563,077 A | | 10/1996 | Ha |
| 5,578,513 A | | 11/1996 | Maegawa |
| 5,658,806 A | * | 8/1997 | Lin et al. ...................... 438/157 |
| 5,716,879 A | * | 2/1998 | Choi et al. ................... 438/158 |
| 6,376,317 B1 | * | 4/2002 | Forbes et al. ................ 438/283 |
| 6,413,802 B1 | | 7/2002 | Hu et al. |
| 6,475,869 B1 | | 11/2002 | Yu |
| 6,483,156 B1 | | 11/2002 | Adkisson et al. |
| 6,611,029 B1 | * | 8/2003 | Ahmed et al. ............... 257/365 |
| 6,680,240 B1 | | 1/2004 | Maszara |
| 6,716,684 B1 | | 4/2004 | Krivokapic et al. |
| 2002/0081794 A1 | | 6/2002 | Ito |
| 2002/0167007 A1 | | 11/2002 | Yamazaki et al. |

FOREIGN PATENT DOCUMENTS

| EP | 0623963 A | 11/1994 |
| WO | WO 02/43151 A1 | 5/2002 |

OTHER PUBLICATIONS

Jong–Tae Park, Pi–Gate SOI MOSFET, IEEE Electron Device Letters, vol. 22, No. 8, Aug. 2001.

Digh Hisamoto et al. Fin FET—A Self Aligned Double–Gate MOSFET Scalable to 20 nm, IEEE Transactions on Electron Devices, vol. 47, No. 12, Dec. 2000.

International Search Report PCT/US 03/26242.

International Search Report PCT/US03/39727.

International Search Report PCT/US 03/40320.

V. Subramanian et al., "A Bulk–Si–Compatible Ultrathin–body SOI Technology for Sub–100m MOSFETS" Proceeding of the 57th Annual Device Research Conference, pp. 28–29 (1999).

(List continued on next page.)

Primary Examiner—Phat X. Cao
Assistant Examiner—Theresa T. Doan
(74) Attorney, Agent, or Firm—Blakely, Sokoloff, Taylor & Zafman LLP

(57) ABSTRACT

The present invention is a semiconductor device comprising a semiconductor body having a top surface and laterally opposite sidewalls formed on a substrate. A gate dielectric layer is formed on the top surface of the semiconductor body and on the laterally opposite sidewalls of the semiconductor body. A gate electrode is formed on the gate dielectric on the top surface of the semiconductor body and adjacent to the gate dielectric on the laterally opposite sidewalls of the semiconductor body.

3 Claims, 13 Drawing Sheets

OTHER PUBLICATIONS

Hisamoto et al., "A Folded–channel MOFSET for Deepsub–tenth Micron Era", 1998 IEEE International Electron Device Meeting Technical Digest, pp. 1032–1034 (1998).

Huang et al., "Sub 50–nm FinFET: PMOS", 1999 IEEE International Electron Device Meeting Technical Digest, pp. 67–70 (1999).

Auth et al., "Vertical, Fully–Depleted, Surroundings Gate MOSFETS On sub–0.1um Thick Silicon Pillars", 1996 54th Annual Device Reserch Conference Digest, pp. 108–109 (1996).

Hisamoto et al., "A Fully Depleted Lean–Channel Transistor (DELTA)–A Novel Vertical Ultrathin SOI MOSFET", IEEE Electron Device Letters, V. 11(1), pp. 36–38 (1990).

* cited by examiner

US 6,858,478 B2

TRI-GATE DEVICES AND METHODS OF FABRICATION

This is a Continuation-In-Part of prior application Ser. No. 10/227,068 filed on Aug. 23, 2002.

BACKGROUND OF THE INVENTION

1. Field of the Invention

The present invention relates to the field of semiconductor integrated circuit manufacturing, and more particularly to a tri-gate fully depleted substrate transistor and its methods of fabrication.

2. Discussion of Related Art

In order to increase device performance, silicon on insulator (SOI) transistors have been proposed for the fabrication of modern integrated circuits. FIG. 1 illustrates a standard fully depleted silicon on insulator (SOI) transistor 100. SOI transistor 100 includes a single crystalline silicon substrate 102 having an insulating layer 104, such as a buried oxide formed thereon. A single crystalline silicon body 106 is formed on the insulating layer 104. A gate dielectric layer 108 is formed on the single crystalline silicon body 106 and a gate electrode 110 formed on the gate dielectric 108. Source 112 and drain 114 regions are formed in the silicon body 106 along laterally opposite sides of gate electrode 110.

Fully depleted SOI have been proposed as a transistor structure to take advantage of ideal sub-threshold gradients for optimized on current/off current ratios. In order to achieve ideal subthreshold gradients with transistor 100, the thickness of the silicon body 106 must be about 1/3 the size of the gate length (Lg) of the transistor or Tsi=Lg/3. However, as gate lengths scale especially as they approach 30 nm, the need for ever decreasing silicon film thickness (Tsi) makes this approach increasingly impractical. At 30 nanometer gate length, the thickness required of the silicon body is thought to need to be less than 10 nanometers, and around 6 nanometer for a 20 nanometer gate length. The fabrication of thin silicon films with thicknesses of less than 10 nanometers, is considered to be extremely difficult. On one hand, obtaining wafer uniformity on the order of one nanometer is a difficult challenge. On the other hand, to be able to contact these thin films to form raised source/drain regions to decrease junction resistance, becomes almost impossible since the thin silicon layer in the source/drain regions becomes consumed during the gate etch and various cleans following the gate etch and spacer etch leaving insufficient silicon 106 for silicon to grow on.

A double gate (DG) device, such as shown in FIGS. 2A and 2B, have been proposed to alleviate the silicon thickness issue. The double gate (DG) device 200 includes a silicon body 202 formed on an insulating substrate 204. A gate dielectric 206 is formed on two sides of the silicon body 202 and a gate electrode 208 is formed adjacent to the gate dielectric 206 formed on the two sides of the silicon body 202. A sufficiently thick insulating layer 209, such as silicon nitride, electrically isolates the gate electrode 208 from the top of silicon body 202.

Double gate (DG) device 200 essentially has two gates, one on: either side of the channel of the device. Because the double gate device 200 has a gate on each side of the channel, thickness (Tsi) of the silicon body can be double that of a single gate device and still obtain a fully depleted transistor operation. That is, with a double gate device 200 a fully depleted transistor can be formed where Tsi=(2×Lg)/3. The most manufacturable form of the double gate (DG) device 200, however, requires that the body 202 patterning be done with photolithography that is 0.7×smaller than that used to pattern the gate length (Lg) of the device. In order to obtain high density integrated circuits, it is generally desirable to have the most aggressive lithography occur with respect to the gate length (Lg) of the gate electrode 208. Although, double gate structures double the thickness of the silicon film (since there now is a gate on either side of the channel) these structures, however, are hideously difficult to fabricate. For example, silicon body 202 requires a silicon body etch which can produce a silicon body 202 with an aspect ratio (height to width) of about 5:1

DETAILED DESCRIPTION OF THE PRESENT INVENTION

The present invention is a novel tri-gate transistor structure and its method of fabrication. In the following description numerous specific details are set forth in order to provide a thorough understanding in the present invention. In other instances, well-known semiconductor process and manufacturing techniques have not been described in particular detail in order to not unnecessarily obscure the present invention.

The present invention is novel tri-gate transistor structure and its method of fabrication. In an embodiment of the present invention, the tri-gate transistor is a semiconductor on insulator (SOI) transistor. The tri-gate transistor is ideal for use in fully depleted substrate transistor applications. The tri-gate transistor includes a thin semiconductor body formed on an substrate, the substrate can be an insulating substrate or a semiconductor substrate. A gate dielectric is formed on the top surface and the sidewalls of the semiconductor body. A gate electrode is formed on the gate dielectric on the top surface of the semiconductor body and is formed adjacent to the gate dielectric formed on the sidewalls of the semiconductor body. Source and drain regions are formed in the semiconductor body on opposite sides of the gate electrode. Because the gate electrode and the gate dielectric surround the semiconductor body on three sides, the transistor essentially has three separate channels and gates. The gate "width" of a transistor is equal to the sum of each of the three sides of the semiconductor body. Larger "width" transistors can be formed by connecting several tri-gate transistors together.

Because there are three separate channels formed in the semiconductor body, the semiconductor body can be fully depleted when the transistor is turned "ON", thereby enabling the formation of a fully depleted transistor with gate lengths of less than 30 nanometers without requiring the use of ultra-thin semiconductor bodies or requiring photolithographic patterning of the semiconductor bodies to dimensions less than the gate length (Lg) of the device. That is, the structure of the tri-gate transistor of the present invention enables a fully depleted transistor to be fabricated where the thickness of the semiconductor body and width of the semiconductor body are equal to the gate length of the device. Because the novel tri-gate transistor of the present invention can be operated in a fully depleted manner, the device is characterized by ideal (i.e., very sharp) subthreshold slope and a reduced drain induced barrier lowering (DIBL) short channel effect of less than 100 mV/V and ideally about 60 mV/V which results in a lower leakage current when the device is turned "OFF" resulting in lower power consumption.

Figure 1:
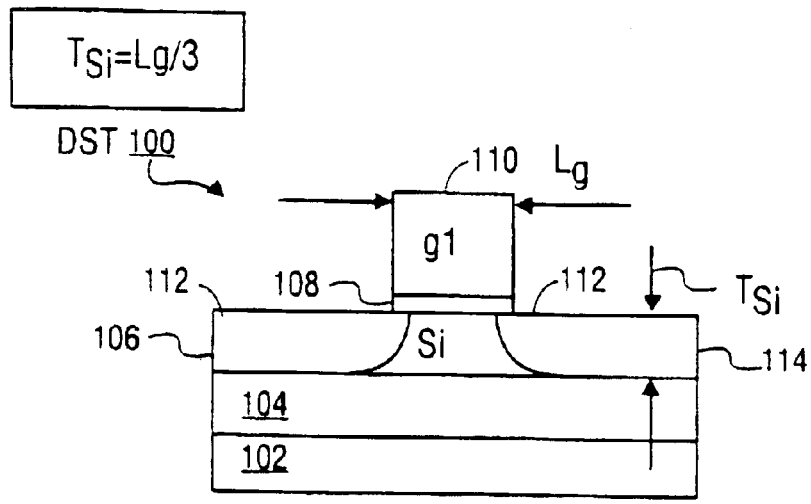
FIG. 1 is an illustration of a cross-sectional view of a depleted substrate transistor.
Figure 2A:
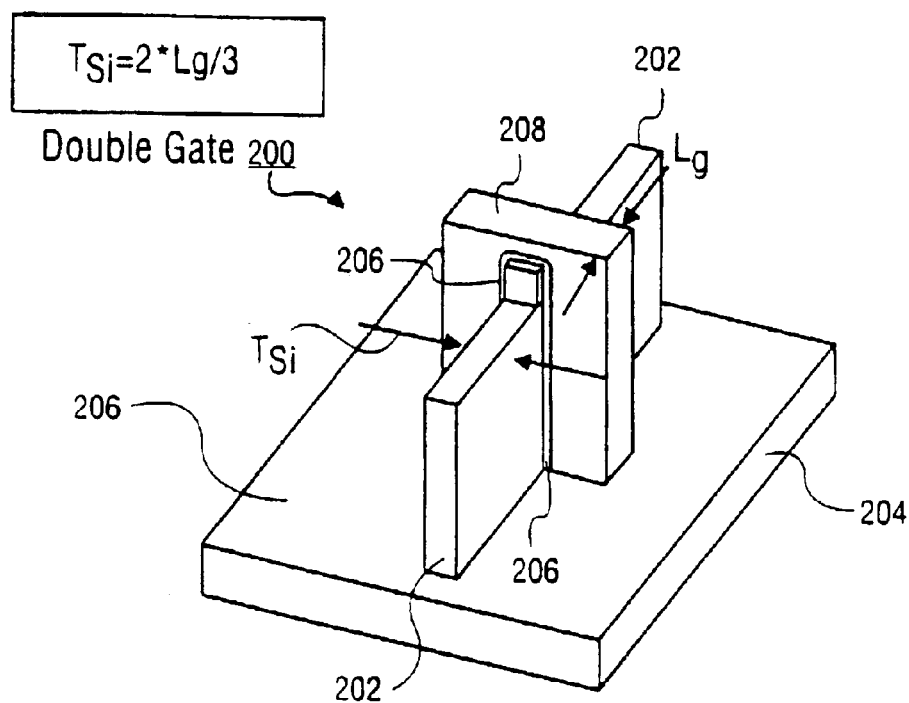
FIG. 2A and FIG. 2B illustrate a double gate depleted substrate transistor.
Figure 2B:
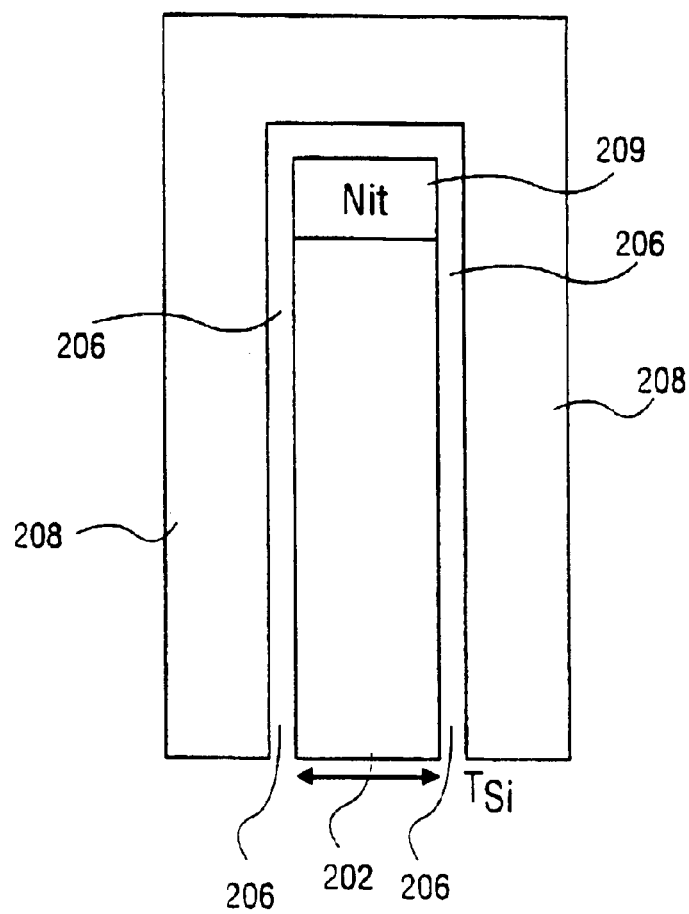
Figure 3:
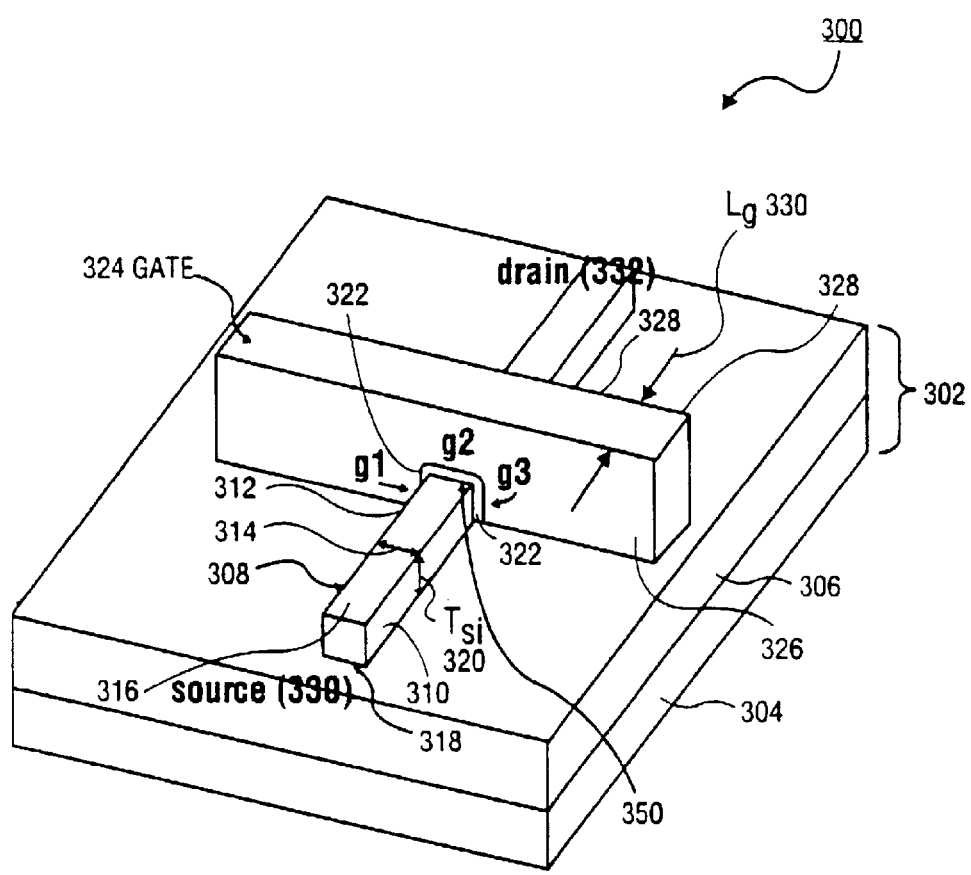
FIG. 3 is an illustration of a tri-gate transistor in accordance with an embodiment of the present invention.

An example of a tri-gate transistor 300 in accordance with an embodiment of present invention as illustrated in FIG. 3. Tri-gate transistor 300 is formed on an substrate 302. In an embodiment of the present invention, substrate 302 is an insulating substrate which includes a lower monocrystalline silicon substrate 304 upon which is formed in insulating layer 306, such as a silicon dioxide film. Tri-gate transistor 300, however, can be formed on any well-known insulating substrate such as substrates formed from silicon dioxide, nitrides, oxides, and shappires. In an embodiment of the present invention, the substrate 302 can be a semiconductor substrate, such as but not limited to monocrystalline silicon substrate and gallium arsenide substrate.

Tri-gate transistor 300 includes a semiconductor body 308 formed on insulator 306 of insulating substrate 302. Semiconductor body 308 can be formed of any well-known semiconductor material, such as but not limited to silicon (Si), germanium (Ge), silicon germanium ($Si_xGe_y$), gallium arsenide (GaAs), InSb, GaP, GaSb and carbon nanotubes. Semiconductor body 308 can be formed of any well-known material which can be reversibly altered from an insulating state to a conductive state by applying external electrical controls. Semiconductor body 308 is ideally a single crystalline film when the best electrical performance of transistor 300, is desired. For example, semiconductor body 308 is a single crystalline film when transistor 300 is used in high performance applications, such as in a high density circuit, such as a microprocessor. Semiconductor body 308, however, can be a polycrystalline film when transistor 300 is used in applications requiring less stringent performance, such as in liquid crystal displays. Insulator 306 insulates semiconductor body 308 from monocrystalline silicon substrate 302. In an embodiment of the present invention, semiconductor body 308 is a single crystalline silicon film. Semiconductor body 308 has a pair of laterally opposite sidewalls 310 and 312 separated by a distance which defines a semiconductor body width 314. Additionally, semiconductor body 308 has a top surface 316 opposite a bottom surface 318 formed on substrate 302. The distance between the top surface 316 and the bottom surface 318 defines a body height 320. In an embodiment of the present invention the body height 320 is substantially equal to the body width 314. In an embodiment of the present invention, the body 308 has a width 314 and height 320 less than 30 nanometers and ideally less than 20 nanometers. In an embodiment of the present invention, the body height 320 is between ½ the body width 314 to 2 times the body width 314.

Tri-gate transistor 300 has a gate dielectric layer 322. Gate dielectric layer 322 is formed on and around three sides of semiconductor body 308 as shown in FIG. 3. Gate dielectric layer 322 is formed on or adjacent to sidewall 312, on top surface 316 and on or adjacent to sidewall 310 of body 308 as shown in FIG. 3. Gate dielectric layer 322 can be any well-known gate dielectric layer. In an embodiment of the present invention, the gate dielectric layer is a silicon dioxide ($SiO_2$), silicon oxynitride ($SiO_xN_y$) or a silicon nitride ($Si_3N_4$) dielectric layer. In an embodiment of the present invention, the gate dielectric layer 322 is a silicon oxynitride film formed to a thickness of between 5–20 Å. In an embodiment of the present invention, gate dielectric layer 322 is a high K gate dielectric layer, such as a metal oxide dielectric, such as but not limited to tantalum pentaoxide ($Ta_2O_5$), and titanium oxide ($TiO_2$). Gate dielectric layer 322 can be other types of high K dielectric, such as but not limited to PZT.

Tri-gate device 300 has a gate electrode 324. Gate electrode 324 is formed on and around gate dielectric layer 322 as shown in FIG. 3. Gate electrode 324 is formed on or adjacent to gate dielectric 322 formed on sidewall 312 of semiconductor body 308, is formed on gate dielectric 322 formed on the top surface 316 of semiconductor body 308, and is formed adjacent to or on gate dielectric layer 322 formed on sidewall 310 of semiconductor body 308. Gate electrode 324 has a pair of laterally opposite sidewalls 326 and 328 separated by a distance which defines the gate length (Lg) 330 of transistor 300. In an embodiment of the present invention the laterally opposite sidewalls 326 and 328 of the gate electrode 324 run in a direction perpendicular to the laterally opposite sidewalls 310 and 312 of semiconductor body 308.

Gate electrode 324 can be formed of any suitable gate electrode material. In an embodiment of the present invention to gate electrode 324 comprises of polycrystalline silicon doped to a concentration density between $1 \times 10^{19}$ atoms/cm$^3$–$1 \times 10^{20}$ atoms/cm$^3$. In an embodiment of the present invention the gate electrode can be a metal gate electrode, such as but not limited to, tungsten, tantalum, titanium, and their nitrides. In an embodiment of the present invention the gate electrode is formed from a material having a mid-gap work function between 4.6–4.8 eV. It is to be appreciated, the gate electrode 324 need not necessarily be a single material and can be a composite stack of thin films, such as but not limited to a polycrystalline silicon/metal electrode or a metal/polycrystalline silicon electrode.

Tri-gate transistor 300 has a source region 330 and a drain region 332. Source region 330 and drain region 332 are formed in semiconductor body 308 on opposite sides of gate electrode 324 as shown in FIG. 3. The source region 330 and the drain region 332 are formed of the same conductivity type such as N-type or P-type conductivity. In an embodiment of the present invention source region 330 and drain region 332 have a doping concentration of between $1 \times 10^{19}$, and $1 \times 10^{21}$ atoms/cm$^3$. Source region 330 and drain region 332 can be formed of uniform concentration or can include subregions of different concentrations or doping profiles such as tip regions (e.g., source/drain extensions). In an embodiment of the present invention when transistor 300 is a symmetrical transistor, source region 330 and drain region 332 will have the same doping concentration and profile. In an embodiment of the present invention when tri-gate transistor 300 is formed as an asymmetric transistor then the doping concentration and profile of the source region 330 and the drain region 332 may vary in order to obtain a particular electrical characteristic.

The portion of semiconductor body 308 located between source region 330 and drain region 332, defines the channel region 350 of transistor 300. The channel region 350 can also be defined as the area of the semiconductor body 308 surrounded by the gate electrode 324. At times however, the source/drain region may extend slightly beneath the gate electrode through, for example, diffusion to define a channel region slightly smaller than the gate electrode length (Lg). In an embodiment of the present invention channel region 350 is intrinsic or undoped monocrystalline silicon. In an embodiment of the present invention, channel region 350 is doped monocrystalline silicon. When channel region 350 is doped it is typically doped to a conductivity level of between $1 \times 10^{16}$ to $1 \times 10^{19}$ atoms/cm$^3$. In an embodiment of the present invention, when the channel region is doped it is typically doped to the opposite conductivity type of the source region 330 and the drain region 332. For example, when the source and drain regions are N-type conductivity the channel region would be doped to p type conductivity. Similarly, when the source and drain regions are P type conductivity the channel region would be N-type conductivity. In this manner a tri-gate transistor 300 can be formed into either a NMOS transistor or a PMOS transistor respectively. Channel region 350 can be uniformly doped or can be doped non-uniformly or with differing concentrations to provide particular electrical and performance characteristics. For example, channel regions 350 can include well-known "halo" regions, if desired.

By providing a gate dielectric and a gate electrode which surrounds the semiconductor body on three sides, the tri-gate transistor is characterized in having three channels and three gates, one (g1) which extends between the source and drain regions on side 312 of silicon body 308, a second (g2) which extends between the source and drain regions on the top surface 316 of silicon body 308, and the third (g3) which extends between the source and drain regions on the sidewall 310 of silicon body 308. The gate "width" (Gw) of transistor 300 is the sum of the widths of the three channel regions. That is, the gate width of transistor 300 is equal to the height 320 of silicon body 308 at sidewall 310, plus the width of silicon body of 308 at the top surface 316, plus the height 320 of silicon body 308 at sidewall 312. Larger "width" transistors can be obtained by using multiple devices coupled together (e.g., multiple silicon bodies 308 surrounded by a single gate electrode 324).

Because the channel region 350 is surrounded on three sides by gate electrode 324 and gate dielectric 322, transistor 300 can be operated in a fully depleted manner wherein when transistor 300 is turned "on" the channel region 350 fully depletes thereby providing the advantageous electrical characteristics and performance of a fully depleted transistor. That is, when transistor 300 is turned "ON" a depletion region is formed in channel region 350 along with an inversion layer at the surfaces of region 350 (i.e., an inversion layer is formed on the side surfaces and top surface of the semiconductor body). The inversion layer has the same conductivity type as the source and drain regions and forms a conductive channel between the source and drain regions to allow current to flow therebetween. The depletion region depletes free carriers from beneath the inversion layer. The depletion region extends to the bottom of channel region 350, thus the transistor can be said to be a "fully depleted" transistor. Fully depleted transistors have improved electrical performance characteristics over non-fully depleted or partially depleted transistors. For example, operating transistor 300 in a fully depleted manner, gives transistor 300 an ideal or very steep subthreshold slope. The tri-gate transistor can be fabricated with very steep sub-threshold slope of less than 80 mV/decade, and ideally about 60 mV/decade even when fabricated with semiconductor body thicknesses of less than 30 nm. Additionally, operating transistor 300 in the fully depleted manner, transistor 300 has an improved drain induced barrier (DIBL) low in effect which provides for better "OFF" state leakage which results in lower leakage and thereby lower power consumption. In an embodiment of the present invention the tri-gate transistor 300 has a DIBL effect of less than 100 mV/V and ideally less than 40 mV/V.

Figure 6:
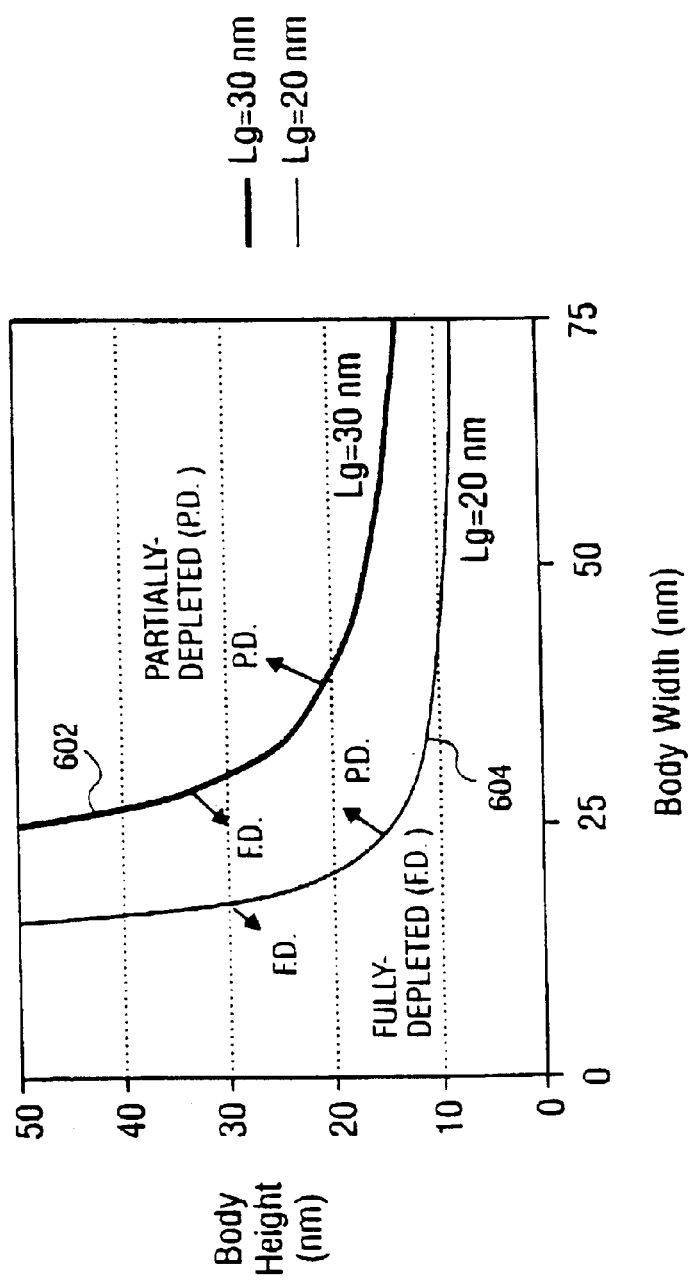
FIG. 6 is a plot which illustrates body heights and body widths which can be used to obtain partially depleted and fully depleted tri-gate transistors having gate lengths (lg) of 30 nm and 20 nm.

FIG. 6 is an illustration of two plots 602 and 604 which set forth the body height and body width which will produce either fully depleted (F.D) or partially depleted (P.D) tri-gate transistors having gate length (Lg) of 30 nm (602) and 20 nm (604) respectively. In an embodiment of the present invention, the body height, body width and gate length are chosen to have dimensions in which a fully depleted transistor will be formed. In other embodiments, the tri-gate transistor has a body height, body width and gate length such that a partially depleted transistor is formed.

The tri-gate transistor of the present invention can be said to be a nonplanar transistor because the inversion layer of the channel region 350 is formed in both the horizontal and vertical directions in semiconductor body 308. The semiconductor device of the present invention can also be considered a nonplanar device because the electric field from the gate electrode 324 is applied from both horizontal ($g_2$) and vertical sides ($g_1$ and $g_3$).

Figure 4A:
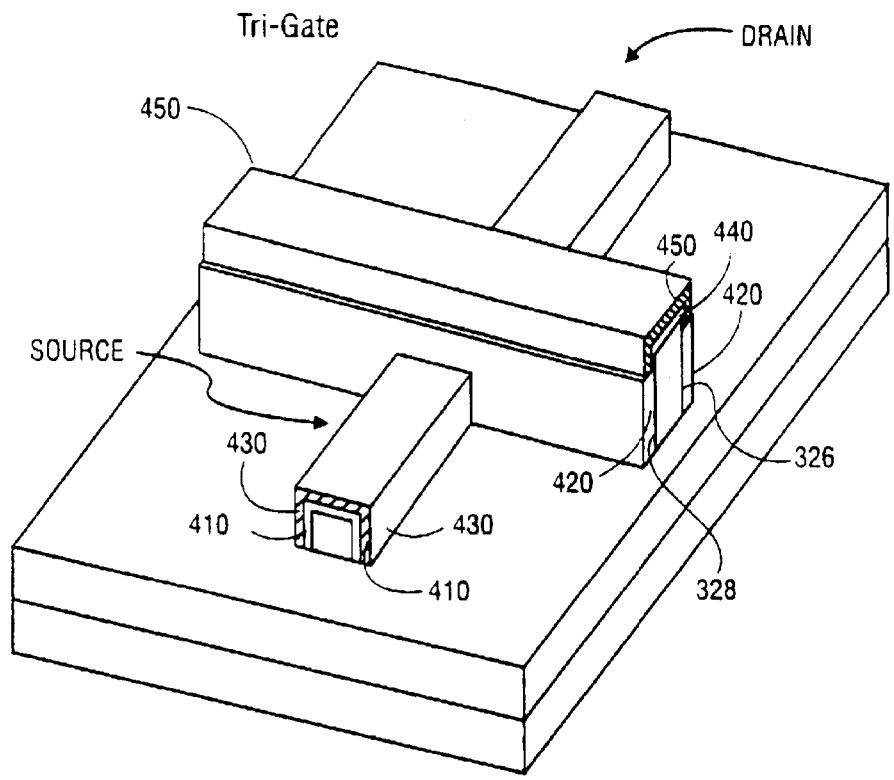
FIG. 4A is an illustration of a tri-gate transistor in accordance with an embodiment of the present invention.

In an embodiment of the present invention tri-gate transistor 300 the source and drain regions can include a silicon or other semiconductor film 410 formed on and around semiconductor body 308 as shown in FIG. 4A. For example, semiconductor film 410 can be a silicon film or a silicon alloy such as silicon germanium ($Si_xGe_y$). In an embodiment of the present invention the semiconductor film 410 is a single crystalline silicon film formed of the same conductivity type as the source region 330 and drain region 332. In an embodiment of the present invention the semiconductor film can be a silicon alloy such as silicon germanium wherein silicon comprises approximately 1 to 99 atomic percent of the alloy. The semiconductor film 410 need not necessarily be a single crystalline semiconductor film and in an embodiment can be a polycrystalline film. In an embodiment of the present invention the semiconductor film 410 is formed on the source region 330 and on the drain region 332 of semiconductor body 308 to form "raised" source and drain regions. Semiconductor film 410 can be electrically isolated from a gate electrode 324 by a pair of dielectric sidewall spacers 420 such as silicon nitride or silicon oxide or composites thereof. Sidewall spacers 420 run along the laterally opposite sidewalls 326 and 328 of gate electrode 324 as shown in FIG. 4A thereby isolating the semiconductor film 410 from gate electrode 324 as shown in FIG. 4A. An embodiment of the present invention sidewalls spacers 420 have a thickness of between 20–200 Å. By adding a silicon or semiconductor film to the source and drain regions 330 and 332 of the semiconductor body and forming "raised" source and drain regions, the thickness of the source and drain regions is increased thereby reducing the source/drain contact resistance to transistor 300 and improving its electrical characteristics and performance.

In an embodiment of the present invention a silicide film 430, such as, but not limited to, titanium silicide, nickel silicide, and cobalt silicide is formed on the source region 330 and drain region 332. In an embodiment of the present invention silicide film 430 is formed on a silicon film 410 of silicon body 308 as shown in FIG. 4A. Silicide film 430 however can also be formed directly onto the top surface 316 of silicon body 308. For example, silicide film 430 can be formed on silicon body 308 by first forming a silicon film such as an undoped silicon film and a silicon body and then completely consuming the silicon film during the silicide process. Dielectric spacers 420 enables silicide film 430 to be formed on semiconductor body 308 or silicon film 410 in a self-aligned process (i.e., a salicide process).

Additionally, in the embodiment of the present invention a semiconductor or silicon film 440 can also be formed on the top of gate electrode 324 as can a silicide film 450 on the top surface gate electrode 325 as can be a silicide film 450. Silicide film 450 and silicon film 440 are typically formed at the same time as silicide film 430 and silicon film 420 on silicon body 308. The formation of a silicon film 440 on silicide film 450 on the gate electrode reduces the contact resistance to the gate thereby improving the electrical performance of transistor 300.

Figure 4B:
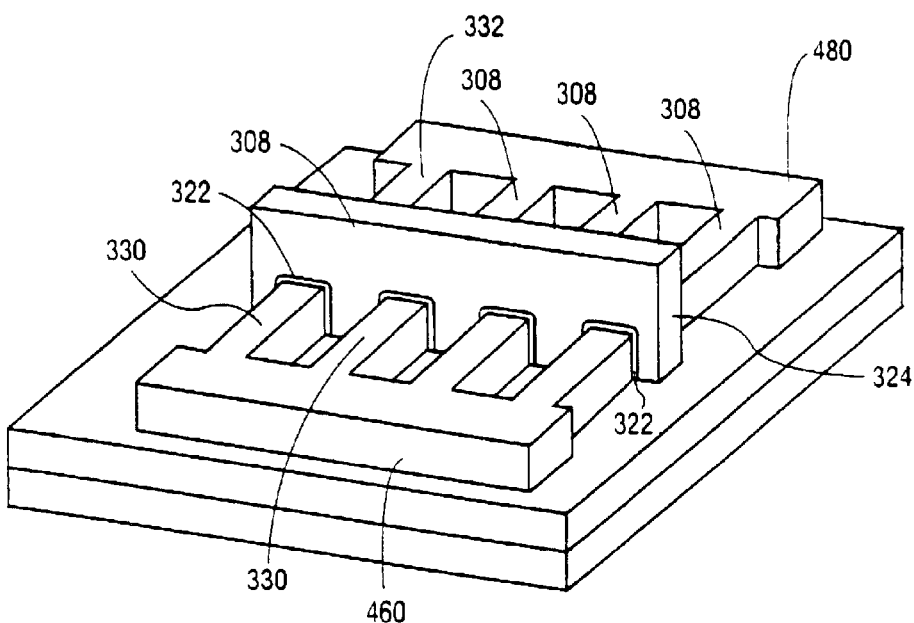
FIG. 4B is an illustration of a tri-gate transistor in accordance with an embodiment of the present invention.

As stated above the gate "width" of transistor 300 is equal to the sum of the three gate width created from semiconductor body 308 of transistor 300. In order to fabricate the transistors with larger gate widths, transistor 300 can include an additional or multiple semiconductor bodies or fingers 308 as shown in FIG. 4B. Each semiconductor body 308 has a gate dielectric layer 322 formed on its top surface and sidewalls as shown in FIG. 4B. Gate electrode 324 is formed on and adjacent to each gate dielectric 322 on each of the semiconductor bodies 308. Each semiconductor body 308 also includes a source region 330 and a drain region 332 formed in the semiconductor body 308 on opposite sides of gate electrode 324 as shown in FIG. 4B. In an embodiment of the present invention each semiconductor body 308 is formed with the same width and height (thickness) as the other semiconductor bodies 308. In an embodiment of the present invention each source regions 330 and drain regions 332 of the semiconductor bodies 308 are electrically coupled together by the semiconductor material used to form semiconductor body 308 to form a source landing pad 460 and a drain landing pad 480 as shown in FIG. 4B. Alternatively, the source regions 330 and drain regions 332 can be coupled together by higher levels of metalization (e.g., metal 1, metal 2, metal 3 . . . ) used to electrically interconnect various transistors 300 together into functional circuits. The gate width of transistor 300 as shown in FIG. 4B would be equal to the sum of the gate width created by each of the semiconductor bodies 308. In this way, the tri-gate transistor 300 can be formed with any gate width desired.

Figure 5A:
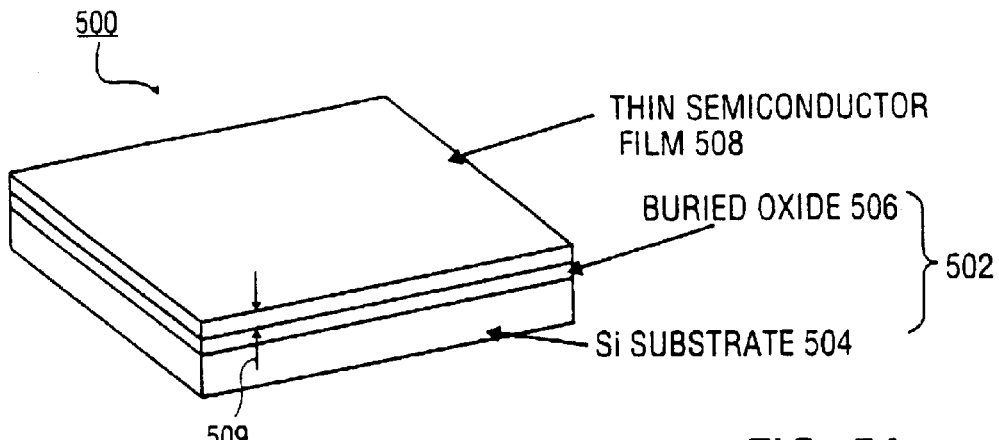
FIGS. 5A–5J illustrate methods of fabricating a tri-gate transistor in accordance with embodiments of the present invention.

A method of fabricating a tri-gate transistor in accordance with embodiments of the present invention is illustrated in FIGS. 5A–5J. The fabrication of a tri-gate transistor begins with substrate 502. A silicon or semiconductor film 508 is formed on substrate 502 as shown in FIG. 5A. In an embodiment of the present invention, the substrate 502 is an insulating substrate, such as shown in FIG. 5A. In an embodiment of the present invention, insulating substrate 502 includes a lower monocrystalline silicon substrate 504 and a top insulating layer 506, such as a silicon dioxide film or silicon nitride film. Insulating layer 506 isolates semiconductor film 508 from substrate 504, and in embodiment is formed to a thickness between 200–2000 Å. Insulating layer 506 is sometimes referred to as a "buried oxide" layer. When a silicon or semiconductor film 508 is formed on an insulating substrate 502, a silicon or semiconductor on insulating (SOI) substrate 500 is created. In other embodiments of the present invention, the substrate 502 can be a semiconductor substrate, such as but not limited to a silicon monocrystalline substrate and a gallium arsenide substrate.

Although semiconductor film 508 is ideally a silicon film, in other embodiments it can be other types of semiconductor films, such as but not limited to germanium (Ge), a silicon germanium alloy ($Si_xGe_y$), gallium arsenide (GaAs), InSb, GaP, GaSb, as well as carbon nanotubes. In an embodiment of the present invention, semiconductor film 508 is an intrinsic (i.e., undoped) silicon film. In other embodiments, semiconductor film 508 is doped to a p type or n type conductivity with a concentration level between $1 \times 10^{16}$–$1 \times 10^{19}$ atoms/cm$^3$. Semiconductor film 508 can be insitu doped (i.e., doped while it is deposited) or doped after it is formed on substrate 502 by for example ion-implantation. Doping after formation enables both PMOS and NMOS tri-gate devices to be fabricated easily on the same insulating substrate. The doping level of the semiconductor body at this point determines the doping level of the channel region of the device.

Semiconductor film 508 is formed to a thickness which is approximately equal to the height desired for the subsequently formed semiconductor body or bodies of the fabricated tri-gate transistor. In an embodiment of the present invention, semiconductor film 508 has a thickness or height 509 of less than 30 nanometers and ideally less than 20 nanometers. In an embodiment of the present invention, semiconductor film 508 is formed to the thickness approximately equal to the gate "length" desired of the fabricated tri-gate transistor. In an embodiment of the present invention, semiconductor film 508 is formed thicker than desired gate length of the device. In an embodiment of the present invention, semiconductor film 580 is formed to a thickness which will enable the fabricated tri-gate transistor to be operated in a fully depleted manner for its designed gate length (Lg).

Semiconductor film 508 can be formed on insulating substrate 502 in any well-known method. In one method of forming a silicon on insulator substrate, known as the SIMOX technique, oxygen atoms are implanted at a high dose into a single crystalline silicon substrate and then anneal to form the buried oxide 506 within the substrate. The portion of the single crystalline silicon substrate above the buried oxide becomes the silicon film 508. Another technique currently used to form SOI substrates is an epitaxial silicon film transfer technique which is generally referred to as bonded SOI. In this technique a first silicon wafer has a thin oxide grown on its surface that will later serve as the buried oxide 506 in the SOI structure. Next, a high dose hydrogen implant is made into the first silicon wafer to form a high stress region below the silicon surface of the first wafer. This first wafer is then flipped over and bonded to the surface of a second silicon wafer. The first wafer is then cleaved along the high stress plain created by the hydrogen implant. This results in a SOI structure with a thin silicon layer on top, the buried oxide underneath all on top of the single crystalline silicon substrate. Well-known smoothing techniques, such as HC smoothing or chemical mechanical polishing (CMP) can be used to smooth the top surface of semiconductor film 508 to its desired thickness.

At this time, if desired, isolation regions (not shown) can be formed into SOI substrate 500 in order to isolate the various transistors to be formed therein from one another. Isolation regions can be formed by etching away portions of the substrate film 508 surrounding a tri-gate transistor, by for example well-known photolithographic and etching techniques, and then back filling the etched regions with an insulating film, such as $SiO_2$.

Figure 5B:
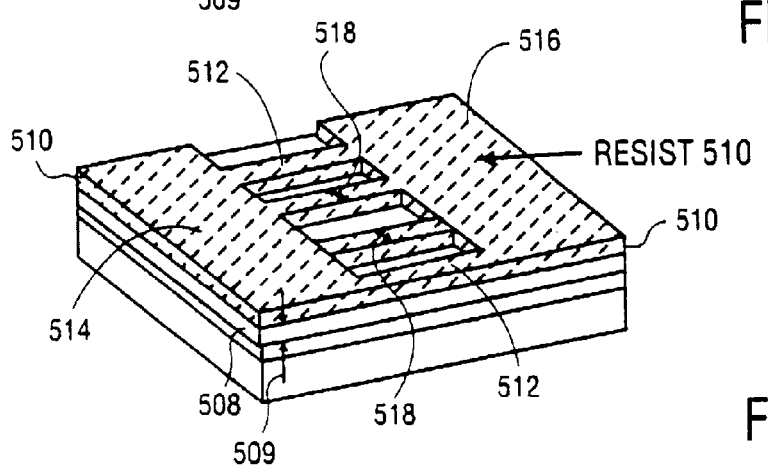

In order to form a tri-gate transistor on substrate 500, a photoresist mask 510 is formed on semiconductor film 508 as shown in FIG. 5B. The photoresist mask 510 contains a pattern or plurality of patterns 512 defining locations where semiconductor bodies or fins will be subsequently formed in the semiconductor film 508. The photoresist pattern 512 defines the width 518 desired of the subsequently formed semiconductor bodies or fins of the tri-gate transistor. In an embodiment of the present invention, the pattern 512 define fins or bodies having a width 518 which is equal to or greater than the width desired of the gate length (Lg) of the fabricated transistor. In this way, the most stringent photolithography constraints used to fabricate the transistor are associated with the gate electrode patterning and not the semiconductor body or fin definition. In an embodiment of the present invention, the semiconductor bodies or fins will have a width 518 less than or equal to 30 nanometers and ideally less than or equal to 20 nanometers. In an embodiment of the present invention, the patterns 512 for the semiconductor bodies or fins have a width 518 approximately equal to the silicon body height 509. In an embodiment of the present invention, the photoresist patterns 512 have a width 518 which is between ½ the semiconductor body height 509 and two times the semiconductor body height 509.

Additionally, as shown in FIG. 5B, the photoresist mask 510 can also include patterns 514 and 516 for defining locations where source landing pads and drain landing pads, respectively, are to be formed. The landing pads can be used to connect together the various source regions and to connect together the various drain regions of the fabricated transistor. The photoresist mask 510 can be formed by well-known photolithographic techniques including masking, exposing, and developing a blanket deposited photoresist film.

Figure 5C:
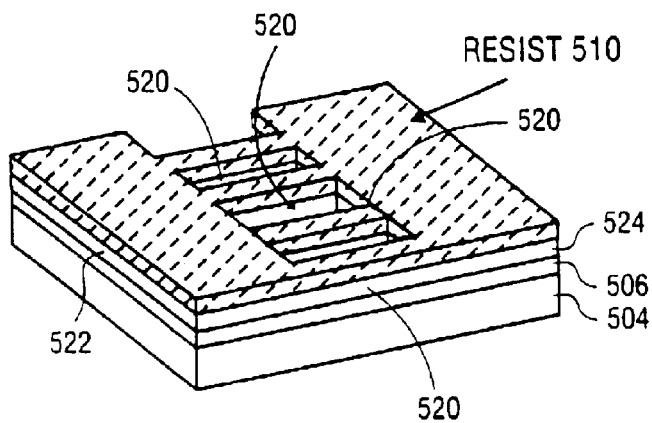

After forming photoresist mask 510, semiconductor film 508 is etched in alignment with photoresist mask 510 to form one or more silicon bodies or fins and source and drain landing pads (if desired) as shown in FIG. 5C. Semiconductor film 508 is etched until the underlying buried oxide layer 506 is exposed. Well-known semiconductor etching techniques, such as anisotropic plasma etching or reactive ion etching can be used to etch semiconductor film 508 in alignment with mask 510 as shown in FIG. 5C.

Figure 5D:
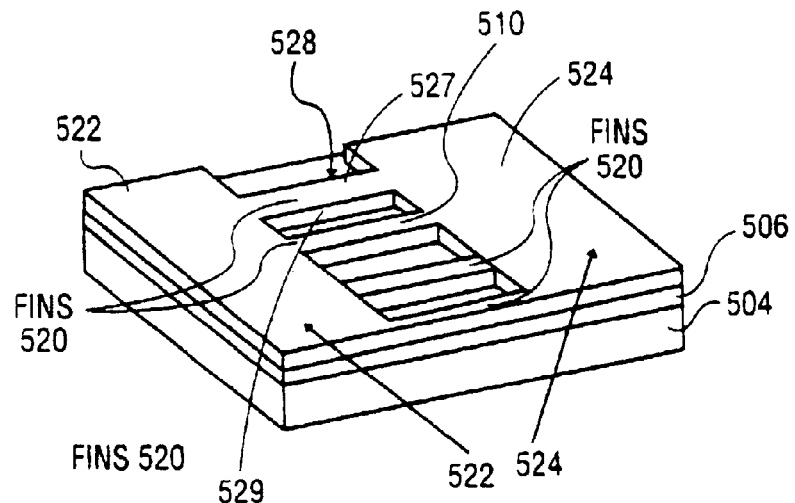

After semiconductor film 508 is etched to form semiconductor bodies or fins 520 (and source/drain landing pads 522 and 524, if desired) the photoresist mask is removed by well-known techniques, such as by chemical stripping and $O_2$ ashing, to produce the substrate shown in FIG. 5D.

Next, a gate dielectric layer 526 is formed on and around each semiconductor body 520. That is, a gate dielectric layer 526 is formed on the top surface 527 of each of the semiconductor bodies 520 as well as on the laterally opposite sidewalls 528 and 529 of each of the semiconductor bodies 520. The gate dielectric can be a deposited dielectric or a grown dielectric. In an embodiment of the present invention, the gate dielectric layer 526 is a silicon dioxide dielectric film grown with a dry/wet oxidation process. In an embodiment of the present invention, the silicon oxide film is grown to a thickness of between 5–15 Å. In an embodiment of the present invention, the gate dielectric film 526 is a deposited dielectric, such as but not limited to a high dielectric constant film, such as metal oxide dielectric, such as tantalum pentaoxide ($Ta_2O_5$) and titanium oxide (TiO2) or other high-K dielectrics, such as PZT and BST. A high dielectric constant film can be formed by any well-known technique, such as by chemical vapor deposition (CVD).

Figure 5E:
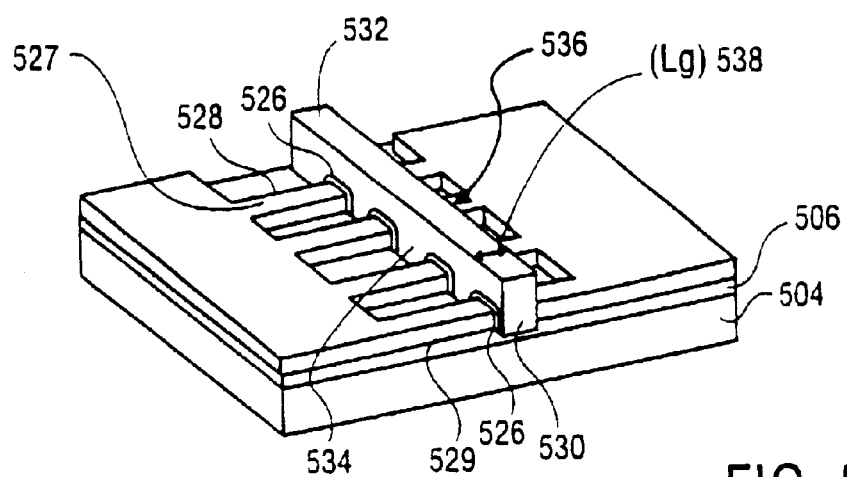

Next, as shown in FIG. 5E, a gate electrode 530 is formed. The gate electrode 530 is formed on the gate dielectric layer 526 formed on the top surface 527 of each of the semiconductor bodies 520 and is formed on or adjacent to the gate dielectric 526 formed on or adjacent to the sidewalls 528 and 529 of each of the semiconductor bodies as shown in FIG. 5E. The gale electrode 530 has a top surface 532 opposite of bottom surface formed on the insulating substrate 502 and has a pair of laterally opposite sidewalls 534 and 536. The distance between the laterally opposite sidewalls 534 and 536 define the gate length (Lg) 538 of the tri-gate transistor. Gate electrode 530 can be formed by blanket depositing a suitable gate electrode material over the substrate shown in FIG. 5D. The gate electrode can be formed to a thickness 533 between 200–3000 Å. In an embodiment the gate electrode has a thickness or height 533 of at least three times the height 509 of semiconductor bodies 520. The gate electrode material is then patterned with well-known photolithography and etching techniques to form gate electrode 530 from the gate electrode material. In embodiment of the present invention, the gate electrode material comprises polycrystalline silicon. In another embodiment of the present invention, the gate electrode material comprises a polycrystalline silicon germanium alloy. In yet other embodiment of the present invention, the gate electrode material can comprise a metal film, such as tungsten, tantalum, and their nitrides. Gate electrode 530 can be formed by well-known techniques, such as by blanket depositing a gate electrode material over the substrate of FIG. 5D and then patterning the gate electrode material with well-known photolithography and etching techniques. In an embodiment of the present invention, the photolithography process used to define gate electrode 530 utilizes the minimum or smallest dimension lithography process used to fabricate the tri-gate transistor. (That is, in an embodiment of the present invention, the gate length (Lg) 538 of gate electrode 530 has a minimum feature dimension of the transistor defined by photolithography.) In an embodiment of the present invention, the gate length 538 is less than or equal to 30 nanometers and ideally less than or equal to 20 nanometers.

Figure 5F:
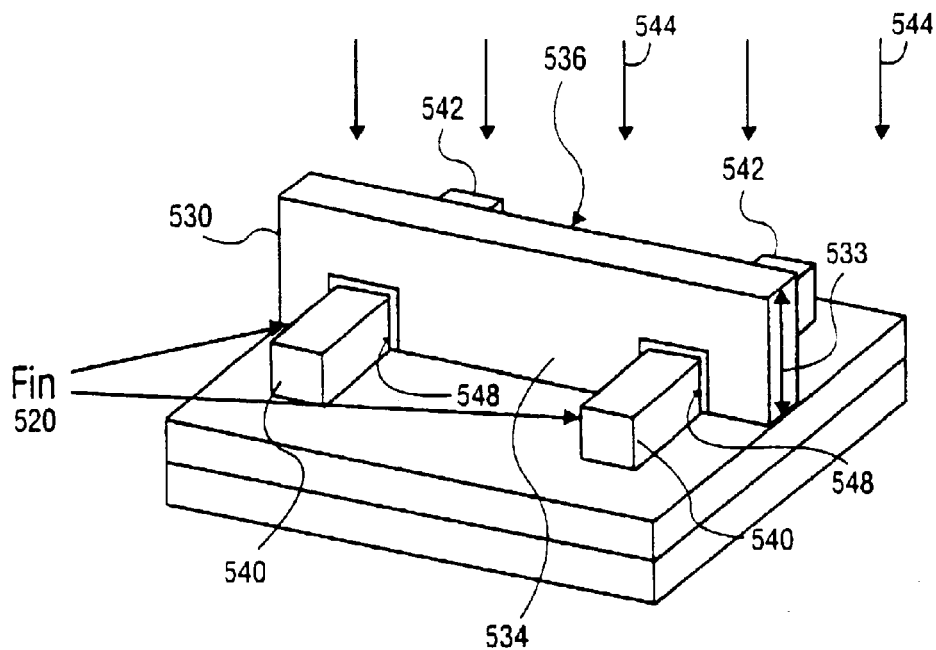

Next, source and drain regions for the transistor are formed in semiconductor body 520 on opposite sides of gate electrode 530. In an embodiment of the present invention, the source and drain regions include tip or source/drain extension regions. Source and drain extension regions 540 and 542, respectively, can be formed by placing dopants 544 into semiconductor bodies 520 on both sides 532, 534 of gate electrode 530 in order to form tip regions 540 and 542 as shown in FIG. 5F. Source and drain landing pads 522 and 524 are not shown in FIGS. 5F–5J to better illustrate aspects of the present invention. If source and drain landing pads 522 and 524 are utilized, they may be doped at this time also. For a PMOS tri-gate transistor, the semiconductor fins or bodies 520 are doped to a p type conductivity and to a concentration between $1\times10^{20}$–$1\times10^{21}$ atoms/cm$^3$. For a NMOS tri-gate transistor, the semiconductor fins or bodies 520 is doped with n type conductivity ions to a concentration between $1\times10^{20}$–$1\times10^{21}$ atoms/cm$^3$. In an embodiment of the present invention, the silicon films are doped by ion-implantation. In an embodiment of the present invention, the ion-implantation occurs in a vertical direction (i.e., a direction perpendicular to substrate 500) as shown in FIG. 5F. When gate electrode 530 is a polysilicon gate electrode, it can be doped during the ion-implantation process. Gate electrode 530 acts as a mask to prevent the ion-implantation step from doping the channel region(s) 548 of the tri-gate transistor. The channel region 548 is the portion of the silicon body 520 located beneath or surrounded by the gate electrode 530. If gate electrode 530 is a metal electrode, a dielectric hard mask maybe used to block the doping during the ion-implantation process. In other embodiments, other methods, such as solid source diffusion, may be used to dope the semiconductor body to form source and drain extensions.

In embodiments of the present invention, "halo" regions can be formed in silicon body prior to the formation of a source/drain regions or source/drain extension regions. Halo regions are doped regions formed in the channel region 548 of the device and are of the same conductivity but of a slightly higher concentration than the doping of the channel region of the device. Halo regions can be formed by ion-implantating dopants beneath the gate electrode by utilizing large angled ion-implantation techniques.

Next, if desired, the substrate shown in FIG. 5F can be further processed to form additional features, such as heavily doped source/drain contact regions, deposited silicon on the source and drain regions as well as the gate electrode, and the formation of silicide on the source/drain contact regions as well as on the gate electrode.

In embodiments of the present invention, dielectric sidewall spacers 550 can be formed on the sidewalls of the gate electrode. Sidewall spacers can be utilized to offset heavy source/drain contact implants, can be used to isolate source/drain regions from the gate electrode during a selective silicon deposition processes and can be used in a salicide process to form silicide on the source and drain regions as well as on the gate electrode. Spacers can be formed by blanket depositing a conformal dielectric film 550, such as but not limited to silicon nitride, silicon oxide, silicon oxynitride or combination thereof over the substrate 500 of FIG. 5F. Dielectric film is deposited in a conformal manner so that it forms to substantially equal heights on vertical surfaces, such as sidewalls 534 and 536 of gate electrode 530 as well as on horizontal surfaces, such as on the top 526 of silicon film 520 and the top of gate electrode 530. In an embodiment of the present invention, the dielectric film is a silicon nitride film formed by a hot wall low-pressure chemical vapor deposition (LPCVD) process. The deposited thickness of the dielectric film determines the width or thickness of the formed spacers. In an embodiment of the present invention, the dielectric film is formed to a thickness between 20–200 Å.

Figure 5G:
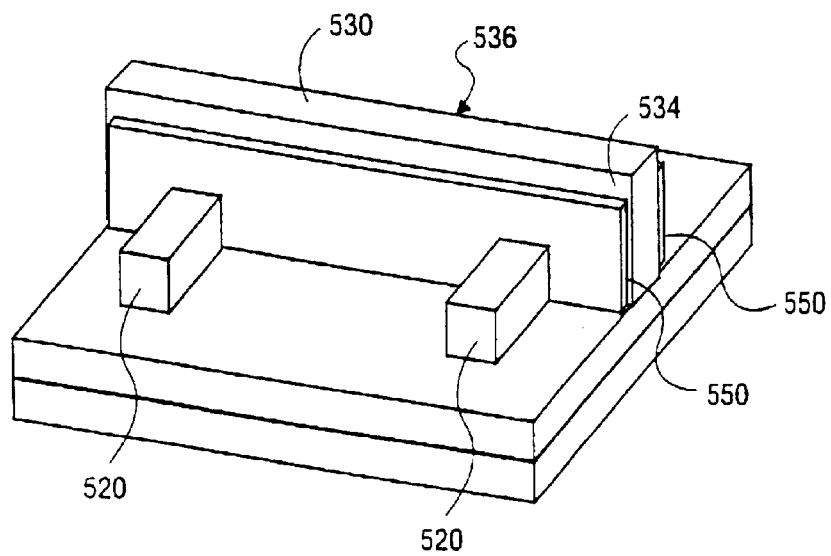

Next, as shown in FIG. 5G, the dielectric film is anisotropically etched by for example plasma etching or reactive ion etching to form sidewall spacers 550. The anisotropic etch of dielectric film removes the dielectric film from horizontal surfaces, such as the top of gate electrode 530 (as well as the top of landing pads 522 and 524 if used) and leaves dielectric sidewall spacers adjacent to vertical surfaces, such as sidewalls 534 and 536 of gate electrode 530. The etch is continued for a sufficient period of time to remove the dielectric film from all horizontal surfaces. In an embodiment of the present invention, an over etch is utilized so that the spacer material on the sidewalls of the semiconductor bodies 520 is removed as shown in FIG. 5G. The result is the formation of sidewall spacers 550 which run along and adjacent to sidewall 532 and 534 of gate electrode 530 as shown in FIG. 5H.

Figure 5H:
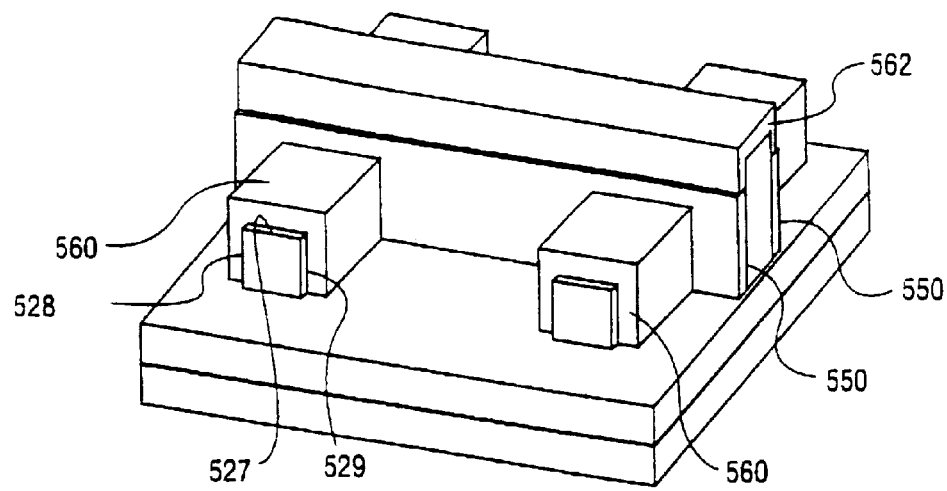

Next, if desired, a semiconductor film 560 can be formed on the exposed surfaces of semiconductor body 520 (as well as on landing pads 522 and 524) as shown in FIG. 5H. Additionally, if desired, a semiconductor film 562 can be formed on the top of gate electrode 530. The semiconductor film can be a single crystalline film or a polycrystalline film. In an embodiment of present invention, semiconductor film 560 is an epitaxial (single crystalline) silicon film. In an embodiment of the present invention, the silicon film 560 is formed by a selective deposition process whereby silicon is formed only on exposed regions which contain silicon, such as the exposed top surface 527 and sidewalls 528 and 529 of silicon body 520. In a selective deposition process the silicon film does not form on dielectric areas, such as sidewall spacers 555. When gate electrode 530 comprises a polycrystalline silicon film, silicon film would also selectively form on the top surface of gate electrode 530 to form silicon film 562. In an embodiment of present invention, a silicon film 560 is formed to a thickness between 50–500 Å. In an embodiment of the present invention, the silicon film is formed to a thickness sufficient to provide enough silicon to be used or consumed during the formation of a silicide film on the source and drain regions. The silicon film can be insitu doped (i.e., doped during deposition) or subsequently doped by for example ion-implantation or solid source diffusion. The silicon film is doped to the conductivity type desired for the source and drain regions of the device. In an embodiment of the present invention, the deposited silicon film 560 and 562 are intrinsic silicon films (i.e., undoped silicon films). The deposition of semiconductor film 560 forms raised source and drain regions which improves the parasitics of the device.

Figure 5I:
Figure 5I:
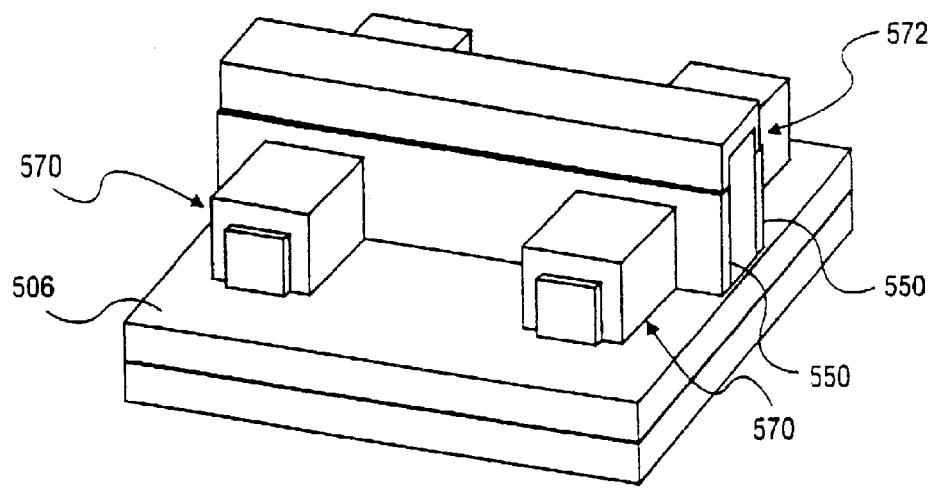

In an embodiment of the present invention, as shown in FIG. 5I, the deposited silicon film 560 and 562 are doped by ion-implantation utilizing a vertical ion-implantation angle. The ion-implantation process dopes the deposited silicon film 560 and the silicon body 520 located underneath to a concentration between $1\times10^{20}$–$1\times10^{21}$ atoms/cm$^3$ to form a source contact region 570 and a drain contact region 572. Sidewall spacers 550 offset the source/drain contact implantation step and define the tips regions as a region of the doped silicon body beneath sidewall spacer 550. The above referenced process forms source regions 570 and drain regions 572 which each comprise a tip region and a contact region. The tip region is the region of the silicon body 520 located beneath sidewall spacers 555. The contact regions are the regions of the silicon body and deposited silicon film which are adjacent to the outside edges of the sidewall spacers 550. Additionally, the source/drain contact regions include the source and drain landing pads 522 and 524 when utilized.

Figure 5J:
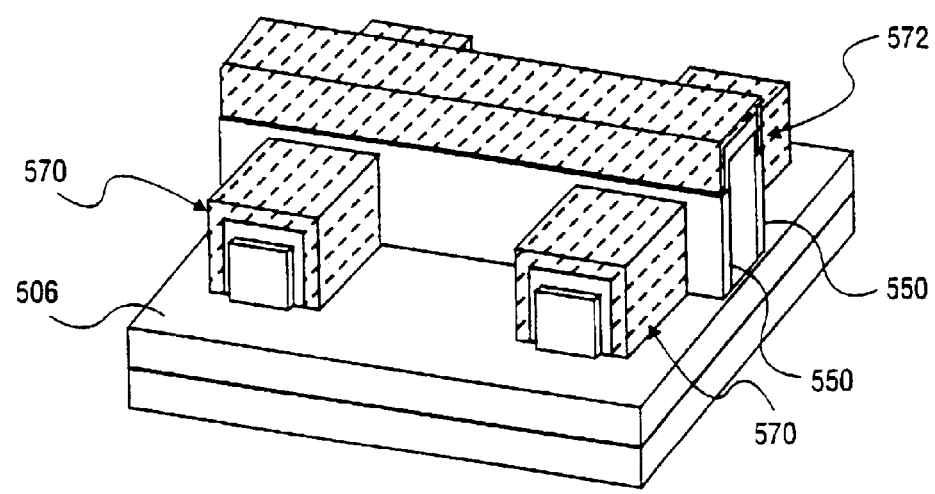

Next, if desired, a refractory metal silicide 580 can be formed on the source and drain contact regions as well as on the top of gate electrode 530 (or silicon film 562) as shown in FIG. 5J. A refractory metal silicide film 580 can be formed with a self-aligned process, such as a salicide process. In a salicide process a refractory metal film, such as titanium, tungsten, nickel, cobalt or alike to blanket deposited over the substrate of FIG. 5J. The substrate is then heated to a suitable temperature to cause the refractory metal film to react with silicon portion of substrate 500, such as silicon film 560 formed on the silicon bodies and silicon film 562 formed on the gate electrodes in order to form a refractory metal silicide. Locations where silicon is unavailable to react, such as dielectric spacers 555 and exposed portions of buried oxide 506, do not react and remain as refractory metal. A selective etch, such as a wet etch can then be utilized to remove the unreacted refractory metal and leave the refractory metal silicide on the contact areas. In this way, a metal silicide film can be self-aligned to the contact regions of a tri-gate transistor. This completes the fabrication of a tri-gate transistor in accordance with the present invention.

In an embodiment of the present invention the gate dielectric layer is formed such that the sidewall capacitance of the trigate or nonplanar transistor is reduced. Applicant has discovered that the majority of the current conduction of a trigate or nonplanar transistor occurs at the corner of the semiconductor body between the top surface and the laterally opposite sidewalls of the semiconductor body. Because little current is conducted on the sidewalls, it desirable to reduce the gate capacitance associated with the sidewalls to thereby improve the device current per unit capacitance of the sidewalls. Accordingly, in an embodiment of the present invention the gate dielectric is fabricated in such a manner so that the gate dielectric layer on the sidewalls of the semiconductor body provides a lower gate capacitance per gate width than does the gate dielectric layer on the top surface of the semiconductor body. A lower gate capacitance per gate width on the sidewalls of the semiconductor body as compared to the top surface can be achieved by, for example, making the gate dielectric layer thicker on the sidewalls of the semiconductor body as compared to the top surface of the semiconductor body and/or making the effective dielectric constant (K effective) of the gate dielectric layer on the sidewalls lower than the effective dielectric constant of the gate dielectric layer on the top surface of a semiconductor body.

Figure 7A:
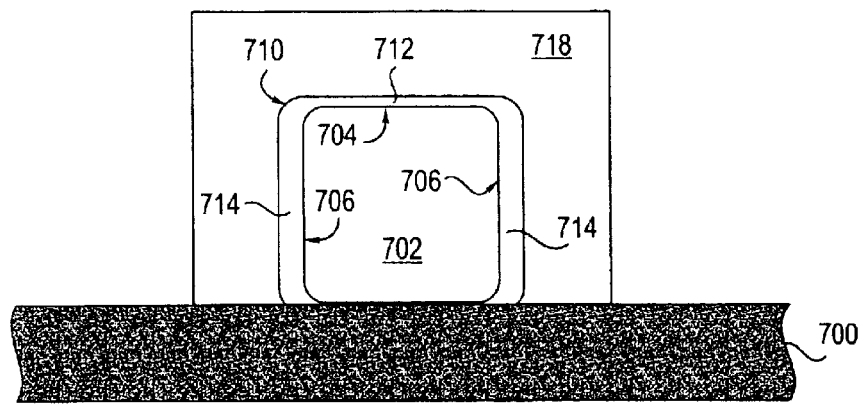
FIG. 7A is an illustration of a nonplanar transistor having a thin gate dielectric layer on the top surface of a semiconductor body and a thicker gate dielectric layer on the sidewalls of the semiconductor body.

In an embodiment of the present invention, a semiconductor body 702 having a top surface 704 and a pair laterally opposite sidewalls 706 is formed on an insulating substrate 700. A gate dielectric layer 710 is formed on and around the semiconductor body 702 as shown in FIG. 7A. The gate dielectric layer 710 includes a first portion 712 formed on the top surface 704 of the semiconductor body 702 and a second portion 714 formed on or directly adjacent to the sidewalls 706 of semiconductor body 702. As shown in FIG. 7A, the gate dielectric layer 714 on the sidewalls 706 of the semiconductor body 702 is thicker than the gate dielectric layer 712 on the top surface 704 of the semiconductor body 702. In an embodiment of the present invention, the gate dielectric layer 714 on the sidewalls of the semiconductor body 702 is at least 1.3 times the thickness of the gate dielectric layer 712 formed on the top surface 704 of the semiconductor body 702. A gate electrode 718 is formed on first dielectric portion 712 and on or adjacent to the second dielectric portion 714, as shown in FIG. 7A.

Figure 7B:
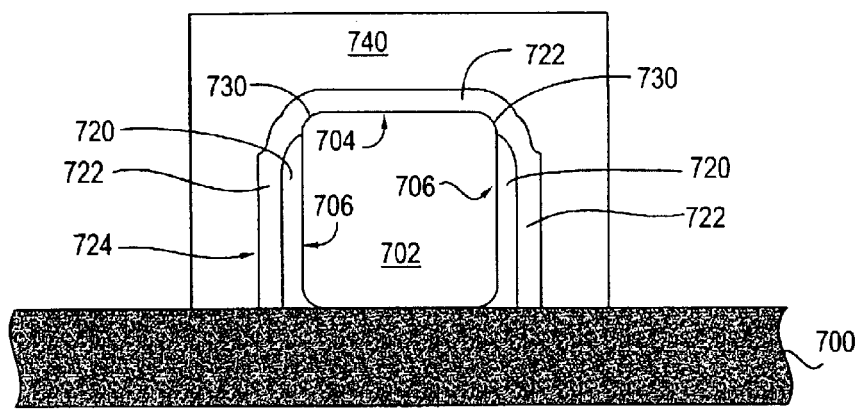
FIG. 7B is an illustration of a nonplanar transistor having a single dielectric layer on the top surface of a semiconductor body and a composite dielectric layer on the sidewalls of the semiconductor body.

In an embodiment of the present invention, as illustrated in FIG. 7B, the gate dielectric layer 724 on the sidewalls 706 of the semiconductor body 702 is a composite gate dielectric which comprises a first dielectric layer 720 formed on or directly adjacent to the sidewalls 706 of the semiconductor body 702 and a second dielectric layer 722 formed on or directly adjacent to the first dielectric layer 720. The second dielectric 722 is also formed directly on the top surface 704 of the semiconductor body 702, as shown in FIG. 7B. In an embodiment of the present invention, the second dielectric layer 722 is a deposited high dielectric constant (high K) film. A high dielectric constant film typically has a dielectric constant of greater than 9.0 and ideally greater than 20. A high dielectric constant film can be a metal oxide dielectric, such as but not limited to tantalum pentaoxide ($Ta_2O_5$), titanium oxide, hafnium oxide, zirconium oxide, and aluminum oxide and various silicates. The second dielectric layer 722, however, can be these or other well known high dielectric constant films, such as lead zirconate titanate (PZT) or barium strontium titatanate (BST). Utilizing a high dielectric constant film enables a gate dielectric to be formed relatively thick between 20–3000 Å and ideally about 200 Å for a high dielectric constant (K>100) material. A thick gate dielectric layer helps block gate leakage current of the device. A gate electrode 740 is formed on second dielectric 722 on the top surface 704 of body 702 and on or adjacent to the composite dielectric 724 adjacent to the sidewalls 706 of body 702, as shown in FIG. 7B.

In an embodiment of the present invention, the first dielectric layer 720 formed on the sidewalls 706 of the semiconductor body 702 is a grown dielectric layer, such as a silicon dioxide or silicon oxynitride film. In an embodiment of the present invention, the first dielectric layer 720 has a dielectric constant (K) less than the dielectric constant of the second dielectric layer 722. When the first dielectric layer 720 has a dielectric constant less than the second dielectric 722, the effective dielectric constant (K effective) of the composite dielectric layer 724 formed on and adjacent to the sidewalls 706 of the semiconductor body 702 will be lower than the dielectric constant of the dielectric film 712 formed on the top surface 704 of the semiconductor body 702. That is, because the composite dielectric 714 comprises a first dielectric layer 720 which has a relatively low dielectric constant (e.g., K less than 8), and a second dielectric 722 which has a high dielectric constant (e.g., K greater than 20), the effective dielectric constant (K effective) of the composite film 724 will be less than the dielectric constant of the high dielectric film 722 formed alone on the top surface. In this way, there is less gate capacitance associated with the sidewalls 706 than the top surface 704. Additionally, because the composite dielectric film 724 formed on the sidewalls 706 of the semiconductor body 702 is thicker than the single dielectric film 722 formed on the top surface 704 of the semiconductor body 702, the gate capacitance associated with the sidewalls is even further decreased.

Additionally, in an embodiment of the present invention, as shown in FIG. 7B, the first dielectric layer 720 is formed on the sidewalls 706 of the semiconductor body 702 below the corners 730 of the semiconductor body between the top surface 704 and the sidewalls 706. In a nonplanar device, such as the trigate device, the majority of the current flow occurs in the vicinity of corners 730 of the semiconductor body 702. By keeping the dielectric film on the corners 730 thin and/or of a high dielectric constant film, the performance of the semiconductor device is greatly improved. Additionally, in an embodiment of the present invention, the corners 730, as shown in FIG. 7B, are rounded which can help improve device performance and/or reliability.

One method of forming a gate dielectric film 710 with a different thickness on the top surface 704 than on the sidewalls 706, as shown in FIG. 7A, is to provide an epitaxial silicon body or fin 702 which contains sidewalls 706 which have a (110) crystal orientation and a top surface 704 which has a (100) crystal orientation. The fins or silicon body 702 can then be thermally oxidized by any well-known process, such as by a wet oxidation (H₂O) or a combination dry/wet oxidation to form the dielectric film 710. Because the (110) crystal orientation silicon exhibits a higher or enhanced thermal oxidation rate than does (100) crystal orientation silicon, the thermal oxidation of the silicon body 702 will result in a thicker oxide on the sidewalls 706 than on the top surface 704 of the semiconductor body. The differential oxidation rate due to the different crystal orientations of the sidewalls and top surface results in a thermally grown oxide having a sidewall to top surface thickness ratio of approximately equal to or greater than 1.3. In an embodiment of the present invention, the gate dielectric film 712 on the top surface of the semiconductor body 702 has a thickness of about 15 Å while the thickness on the sidewalls of the silicon body 702 is approximately 27 Å.

In an embodiment of the present invention, the differential oxide growth rate between the top surface 704 and the sidewalls 706 can be enhanced by incorporating an oxidation resistance or impeding impurity species, such as nitrogen, into the top surface 704 of the silicon body 702. Implanting nitrogen into the top surface 704 impedes or slows the oxidation rate of the top surface of the silicon body thereby providing a larger differential oxide growth rate between the sidewalls and the top surface resulting in a thicker gate dielectric on the sidewalls 706 as compared to the top surface 704. Additionally, incorporating nitrogen into the top surface can result in the formation of a silicon oxynitride film on the top surface 704 of the silicon body 702. It is to be appreciated that a silicon oxynitride film has a higher dielectric constant than does a pure silicon oxide film resulting in a greater difference between the gate capacitance per gate width associated with the sidewalls as compared to the gate capacitance of the top surface.

In an embodiment of the present invention, the sidewalls 706 of semiconductor body 702 can be altered to enhance the oxidation rate of the sidewalls 706 as compared to the top surface 704. For example, the sidewalls 706 can be exposed to a sputter etch process prior to oxidation in order to roughen their surface to provide a greater surface area to enhance the oxidation rate of the sidewalls. Such a roughening process can occur, for example, after etching the silicon body 520 and prior to removing the photoresist mask 510 as shown in FIG. 5A. Alternatively, a hard mask can be formed on the top surface of the semiconductor body to protect the top surface from the roughening process to enable the differential oxide growth.

FIGS. 8A–8D illustrate a method of forming a gate dielectric layer with a greater thickness on the sidewalls of a semiconductor body than on the top surface of a semiconductor body, and/or with a lower effective dielectric constant on the sidewalls of a semiconductor body than on the top surface of a semiconductor body. The process, as set forth in FIG. 8A-8D, can begin after the formation of a semiconductor body or fins as illustrated in FIG. 5D.

Figure 8A:
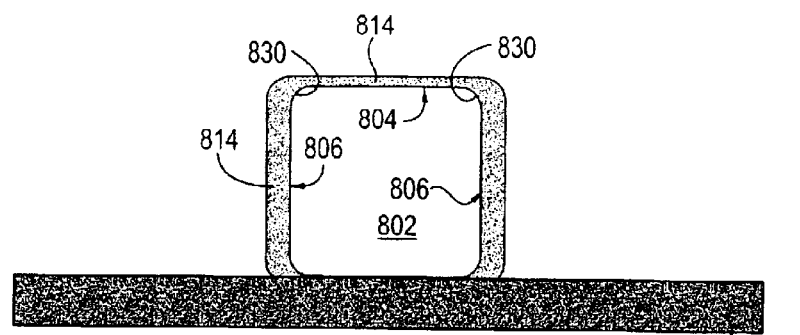
FIGS. 8A–8D illustrate a method of forming a gate dielectric layer with a greater thickness on the sidewalls of a semiconductor body than on the top surface of semiconductor body, and/or with a lower effective dielectric constant on the sidewalls of a semiconductor body than on the top surface of semiconductor body.

The first step as shown in FIG. 8A, is to form a first dielectric layer 814 on the top surface 804 of a semiconductor body 802 and on or directly adjacent to a pair of laterally opposite sidewalls 806 of semiconductor body 802 formed on an insulating substrate 800. In an embodiment of the present invention, the first dielectric layer 814 is a thermally grown silicon dioxide or silicon oxynitride dielectric layer. When semiconductor body 802 is a silicon monocrystalline film having sidewalls with a (110) crystal orientation and a top surface with a (100), a thermal oxidation process will grow a thicker oxide on the sidewalls 806 than on the top surface 804 of the semiconductor body as shown in FIG. 8A. Any well known thermal oxidation process can be used to form the thermally grown silicon oxide or silicon oxynitride film 814. When the first dielectric layer 814 is formed by a thermal oxidation process, the corners 830 are rounded by the oxidation process. Rounded corners 830 improves the reliability and performance of the fabrication transistor. In an embodiment of the present invention, a thermal oxide having a thickness of at least 10 Å (approximately 2–3 monolayers) can be formed on the top surface 804 of the semiconductor body 802 and on the sidewalls 806 on the semiconductor body 802. Although the first dielectric 814 is ideally a grown dielectric, the first dielectric layer 814 can be a deposited dielectric, if desired. In an embodiment of the present invention, the first dielectric layer 814 is formed of a material and to a thickness sufficient to make the sidewall gate capacitance per gate width approximately 30% less than the gate capacitance on the top surface of the semiconductor body.

Figure 8B:
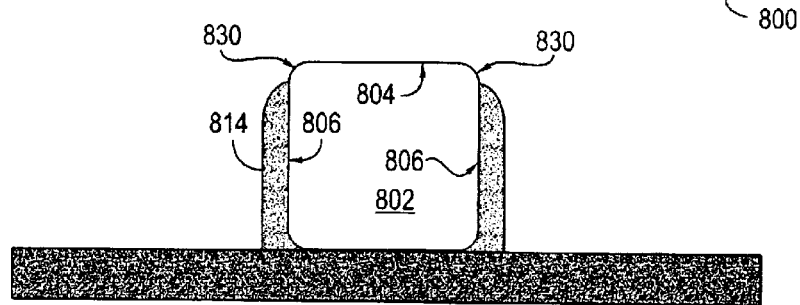

Next, as shown in FIG. 8B, the first portion of the dielectric film 814 formed on the top surface 804 of semiconductor body 802 is removed as shown in FIG. 8B. In an embodiment of the present invention, the portion of the first gate dielectric layer 814 covering the corners 830 of the semiconductor body 802 is also removed. In an embodiment of the present invention, the portion of the first dielectric layer 814 formed on the top surface of the semiconductor body 802 is removed utilizing an anisotropic etching process. Such an etching process will remove the dielectric film 814 from horizontal surfaces, such as the top surface 804 of semiconductor body 802 while leaving the first gate dielectric layer 814 on the sidewalls 806 as shown in FIG. 8B. An over etching process can be utilized to recess the gate dielectric layer 814 on the sidewalls 806 so that the gate dielectric layer 814 covering corners 830 is also removed as shown in FIG. 8B. Any well known anisotropic etching technique can be utilized, such as reactive ion etching (RIE).

Figure 8C:
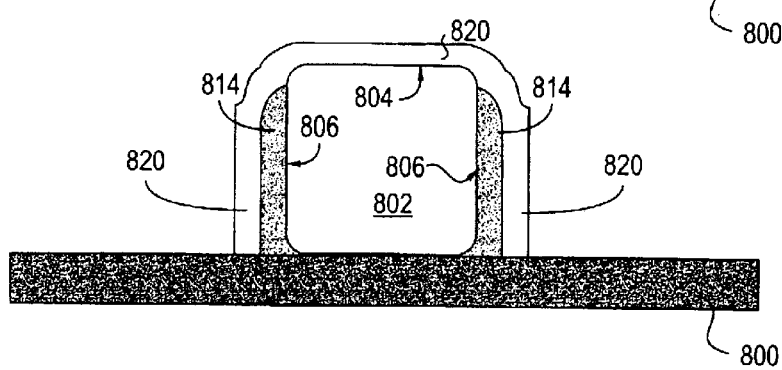

Next, as shown in FIG. 8C, a second dielectric layer 820 is formed directly onto the top surface 804 of semiconductor body 802 as well as on or directly adjacent to first dielectric layer 814 formed on the sidewalls 806 of semiconductor body 802 as shown in FIG. 8C. In an embodiment of the present invention, the second dielectric layer 820 is a deposited high K dielectric film, such as but not limited to PZT, BST, tantalum pentaoxide, hafnium oxide, zirconium oxide and aluminum oxide and various silicates. Any well known and suitable technique can be utilized to deposit second dielectric layer 820 including but not limited to chemical vapor deposition (CVD), atomic layer deposition (ALD), and sputtering (PVD). In an embodiment of the present invention, the second deposited dielectric layer 820 is formed to a thickness between 20–3000 Å depending on the targeted dielectric thickness.

Figure 8D:
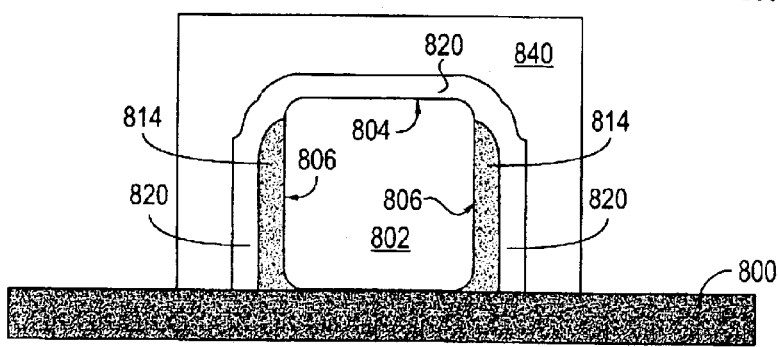

Next, as shown in FIG. 8D, a gate electrode 840 is formed on gate dielectric layer 820 formed on the top surface 804 of semiconductor body 802 as well as formed directly adjacent to second gate dielectric layer 820 formed adjacent to gate dielectric layer 814 formed on sidewalls 806 of semiconductor body 802 as described above. Processing of the fabricated device can then continue as set forth in FIGS. 5F–5J as described above. Although the process shown in FIGS. 8A–8D illustrate a gate dielectric formed from a composite film 814 and 820 on the sidewalls 806 and a single dielectric film 820 on the top surface 804, the above referenced process can be utilized to form three or more films on the sidewalls and one or more films on the top surface in order to obtain and achieve a desired thickness differential and/or effective gate dielectric constant differential between the sidewall gate dielectric and top gate dielectric.

FIGS. 9A–9D illustrate another method of forming a gate dielectric layer with a greater thickness on the sidewalls than on the top surface of a semiconductor body, and/or with gate dielectric layer with a lower effective dielectric constant on the sidewalls than on the top surface of the semiconductor body. According to this embodiment of the present invention, an oxidation resistant mask 908 is formed on the top surface 904 of a semiconductor body 902 having a top surface and laterally opposite sidewalls 906. The oxidation resistant mask 908 can be formed on the top surface of the semiconductor body by, for example, forming a blanket deposition of an oxidation resistant mask film, such as a silicon nitride or silicon oxynitride film, over the semiconductor film 508 shown in FIG. 5A. The oxidation resistant film can then be patterned along with the semiconductor thin film 508 when it is patterned into semiconductor body or fins as shown in FIG. 5C. The oxidation resistant mask is formed of a material and to a thickness sufficient to prevent the underlying top surface 904 of the semiconductor body 902 from oxidizing during a thermal oxidation process. In an embodiment of the present invention, the oxidation resistant mask is a silicon nitride or silicon oxynitride film formed to a thickness between 30–1000 Å.

Figure 9A:
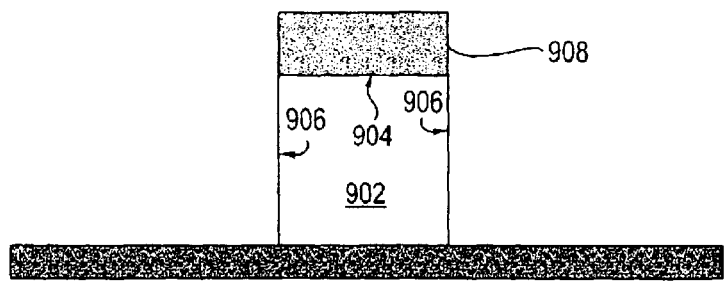
FIGS. 9A–9D illustrate a method of forming a gate dielectric layer with a greater thickness on the sidewalls of a semiconductor body than on the top surface of semiconductor body, and/or with a lower effective dielectric constant on the sidewalls of a semiconductor body than on the top surface of semiconductor body.
Figure 9B:
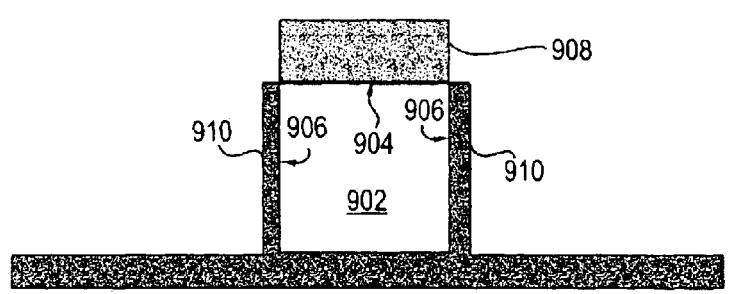

Next, as shown in FIG. 9B, the semiconductor body is exposed to a thermally oxidizing ambient in order to thermally grow a silicon dioxide film 910 on the sidewalls 906 of the semiconductor body 902. The oxidation resistant mask 908 prevents the top surface 904 of the semiconductor body 902 from being oxidized. Any well known thermal oxidation process, such as a wet oxidation or a dry/wet oxidation may be utilized to thermally grow a silicon oxide dielectric layer 910 as shown in FIG. 9B. In an embodiment of the present invention, gate dielectric layer 910 is grown to a thickness of approximately 10 Å or 2–3 monolayers. In an embodiment of the present invention, the thermally grown gate dielectric layer 910 is formed to a thickness sufficient to make the sidewall gate capacitance approximately 30% less than the gate capacitance on the top surface of the semiconductor body. Next, after a sufficiently thick gate dielectric 910 has been formed on the sidewalls 906 of semiconductor body 904, the hard mask film 908 is removed with a selective etch which is selective to the thermally grown silicon dioxide dielectric film 910. A phosphoric acid wet etch can be utilized to remove a hard mask 908 and thereby expose the top surface 904 of semiconductor body 902 without substantially etching sidewall gate oxide dielectric 910.

Figure 9C:
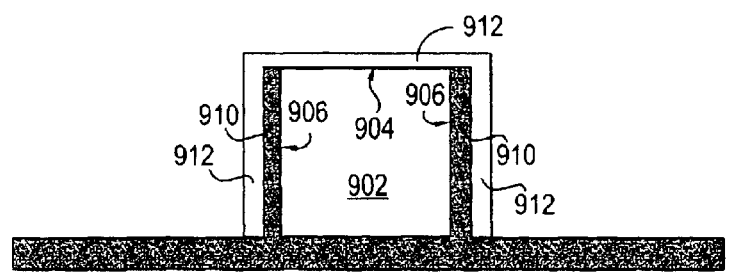

Next, as shown in FIG. 9C, a second dielectric layer 912 is deposited directly onto the top surface 904 of semiconductor body 902 as well as onto or directly adjacent to the dielectric layer 910 on the sidewalls 906 of semiconductor body 902. In an embodiment of the present invention, the deposited dielectric layer 912 is a high K dielectric film, such as but not limited to PZT, BST, tantalum pentaoxide, hafnium oxide, zirconium oxide and aluminum oxide and various silicates. Any well known technique can be utilized to deposit dielectric layer 912, such as but not limited to chemical vapor deposition, atomic layer deposition, and sputtering. The deposited dielectric layer will typically be formed in a conformal manner wherein the thickness on vertical surfaces, such as sidewalls 906 will be similar to the thickness on horizontal surfaces, such as top surface 904. In an embodiment of the present invention, the second dielectric can be deposited to a thickness between 20–3000 Å depending on the targeted dielectric thickness.

Figure 9D:
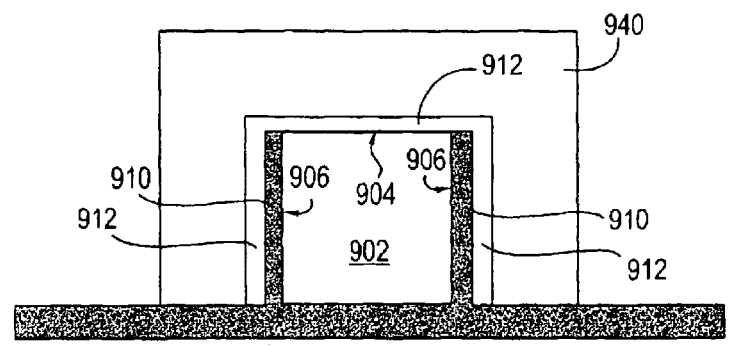

Next, as shown in FIG. 9D, a gate electrode 940 is formed above or directly on top of gate dielectric body 912 formed on the top surface 904 of semiconductor body 902 as well as on or directly adjacent to dielectric layer 912 formed on dielectric 910 on sidewalls 906 of semiconductor body 902 as shown in FIG. 9D and described above. At this point, the nonplanar or trigate semiconductor device can be processed as set forth in FIGS. 5F–5J to complete fabrication of the semiconductor device.

Thus, tri-gate transistors and methods of fabrication have been described.

We claim:

1. A method of forming a semiconductor device comprising:

forming an oxidation resistant film on a semiconductor body film formed on an insulating substrate;

patterning said oxidation resistant film and said semiconductor body film to form an oxidation resistant mask a semiconductor body having a top surface opposite a bottom surface formed on said insulating film, and a first and a second laterally opposite sidewalls, wherein said oxidation resistant mask is formed on said top surface of said semiconductor body;

growing an oxide on the laterally opposite sidewalls of said semiconductor body while said top surface of said semiconductor body is covered by said oxidation resistant mask;

removing said oxidation resistant mask from said top surface of said semiconductor body;

depositing a dielectric film adjacent to said grown oxide on said sidewalls of said semiconductor body and on the top surface of said semiconductor body; and forming a gate electrode above said gate dielectric on said top surface of said semiconductor body and adjacent to said deposited oxide on said laterally opposite sidewalls of said semiconductor body.

2. The semiconductor device of claim 1 wherein said deposited dielectric is a high K dielectric.

3. The semiconductor device of claim 1 wherein said high K dielectric is selected from the group consisting of PZT, BST, tantalum pentaoxide, titanium oxide, hafnium oxide, zirconium oxide, aluminum oxide and silicates thereof.

* * * * *